(12) United States Patent
Lee

(10) Patent No.: US 6,703,296 B1
(45) Date of Patent: Mar. 9, 2004

(54) METHOD FOR FORMING METAL SALICIDE

(75) Inventor: Chung-Yeh Lee, Hsinchu (TW)

(73) Assignee: Macronix International Co. Ltd., Hsinchu (TW)

( * ) Notice: Subject to any disclaimer, the term of this patent is extended or adjusted under 35 U.S.C. 154(b) by 0 days.

(21) Appl. No.: 10/249,529

(22) Filed: Apr. 17, 2003

(51) Int. Cl.$^7$ .............................................. H01L 21/302
(52) U.S. Cl. ........................ 438/582; 438/583; 427/509; 427/569
(58) Field of Search ................................. 438/582, 583; 427/509, 569

(56) References Cited

U.S. PATENT DOCUMENTS

| | | | | |
|---|---|---|---|---|
| 6,200,893 B1 | * | 3/2001 | Sneh | 438/685 |
| 6,573,571 B2 | * | 6/2003 | Li | 257/384 |
| 6,576,062 B2 | * | 6/2003 | Matsuse | 118/719 |
| 2003/0104126 A1 | * | 6/2003 | Fang et al. | 427/255.392 |
| 2003/0123216 A1 | * | 7/2003 | Yoon et al. | 361/303 |

FOREIGN PATENT DOCUMENTS

JP      61-248446    * 11/1986

* cited by examiner

*Primary Examiner*—George A. Goudreau
(74) *Attorney, Agent, or Firm*—Jianq Chyun IP Office

(57) ABSTRACT

A method for forming a metal salicide layer on a shallow junction is described. A substrate having a gate structure thereon and a shallow junction therein is provided. An atomic layer deposition (ALD) process is then performed to deposit a tungsten salicide layer on the shallow junction. In the ALD process, a gaseous silicon-containing compound and a gaseous metal-containing compound that react into metal silicide are introduced alternatively onto the substrate, wherein either compound can be introduced at first. When either compound is introduced at first, the flow rate thereof is controlled so that only a single layer of molecules are adsorbed, while the flow rate of the metal-containing compound is controlled in each case so that few silicon atoms in the substrate are consumed. By repeating the two gas introduction steps, a metal salicide layer constituted of many thin layers is formed on the shallow junction.

17 Claims, 4 Drawing Sheets

METHOD FOR FORMING METAL SALICIDE

BACKGROUND OF INVENTION

1. Field of Invention

The present invention relates to a semiconductor process. More particularly, the present invention relates to a method for forming a metal salicide (self-aligned silicide) layer on a shallow junction.

2. Description of Related Art

In a MOSFET (metal-oxide-semiconductor field effect transistor) process, metal suicide, such as tungsten suicide ($WSi_x$), is usually formed on gates and sources/drains with a salicide process to reduce the resistance of the devices. The metal silicide formed with a salicide process is called "metal salicide".

In the prior art, one method for forming tungsten salicide is selective tungsten chemical vapor deposition (W CVD), wherein silane ($SiH_4$) and tungsten hexafluoride ($WF_6$) are used as reactive gases. In a selective W CVD process, tungsten silicide is formed only on the locations where electron transfer occurs, including the substrate and the exposed portion of a gate, but not on insulators like spacers. The tungsten silicide layer in a selective W CVD process is intended to form via the reaction of $SiH_4$ and $WF_6$, however, still a portion of the silicon substrate is consumed by $WF_6$. The consumption of the silicon atoms in the substrate may damage the source/drain junction of the MOSFET device since ultra-shallow junctions are frequently adopted to inhibit short channel effect (SCE) in advanced processes. Consequently, the device suffers from severe current leakage and has relatively low reliability.

SUMMARY OF INVENTION

Accordingly, this invention provides a method for forming a metal salicide layer on a shallow junction. In the method, few silicon atoms in the substrate are consumed, and the shallow junction therefore is not damaged to cause severe leakage.

The method for forming a metal salicide layer on a shallow junction of this invention comprises the following steps. A substrate having a shallow junction therein is provided. An atomic layer deposition (ALD) process is then performed to deposit a metal salicide layer on the shallow junction. In the ALD process, a gaseous silicon-containing compound and a gaseous metal-containing compound that reacts into metal silicide are introduced alternatively onto the substrate, wherein either compound can be introduced at first.

If the silicon-containing compound is introduced at first, the molecules are adsorbed on the substrate over the shallow junction, and the flow rate of the silicon-containing compound is controlled so that only a single layer of molecules is adsorbed. Then, a pulse of the metal-containing compound is introduced to react with the adsorbed silicon-containing compound to form a thin layer of metal silicide, wherein the flow rate of the metal-containing compound is controlled so that few silicon atoms in the substrate are consumed. By repeating the two gas introduction steps, a metal salicide layer constituted of many thin layers is formed on the shallow junction.

If the metal-containing compound is introduced at first, the molecules are adsorbed on the substrate over the shallow junction, and the flow rate of the metal-containing compound is controlled so that only a single layer of molecules are adsorbed and few silicon atoms in the substrate are consumed. A pulse of the silicon-containing compound is introduced to react with the adsorbed metal-containing compound to form a thin layer of metal silicide. By repeating the two gas introduction steps, a metal salicide layer constituted of many thin layers is formed on the shallow junction.

The substrate may further comprise a gate structure thereon comprising a gate dielectric layer, a polysilicon gate and a spacer, and the metal salicide layer is also formed on the polysilicon gate. Moreover, in the aforementioned method for forming a metal salicide layer on a shallow junction, argon may be introduced after each gas introduction step to remove excess reactive gas and improve the quality of the metal salicide layer.

Since few silicon atoms in the substrate are consumed in this invention with a controlled flow rate of the metal-containing compound, the shallow junction is not damaged, and current leakage that would lower the reliability of the device does not occur.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 2A–2D illustrate a process flow of forming a metal salicide layer on a shallow junction according to the preferred embodiment of this invention in a cross-sectional view, wherein FIG. 2B illustrates the atomic layer deposition (ALD) process in a microscopic view.

DETAILED DESCRIPTION

Figure 1:
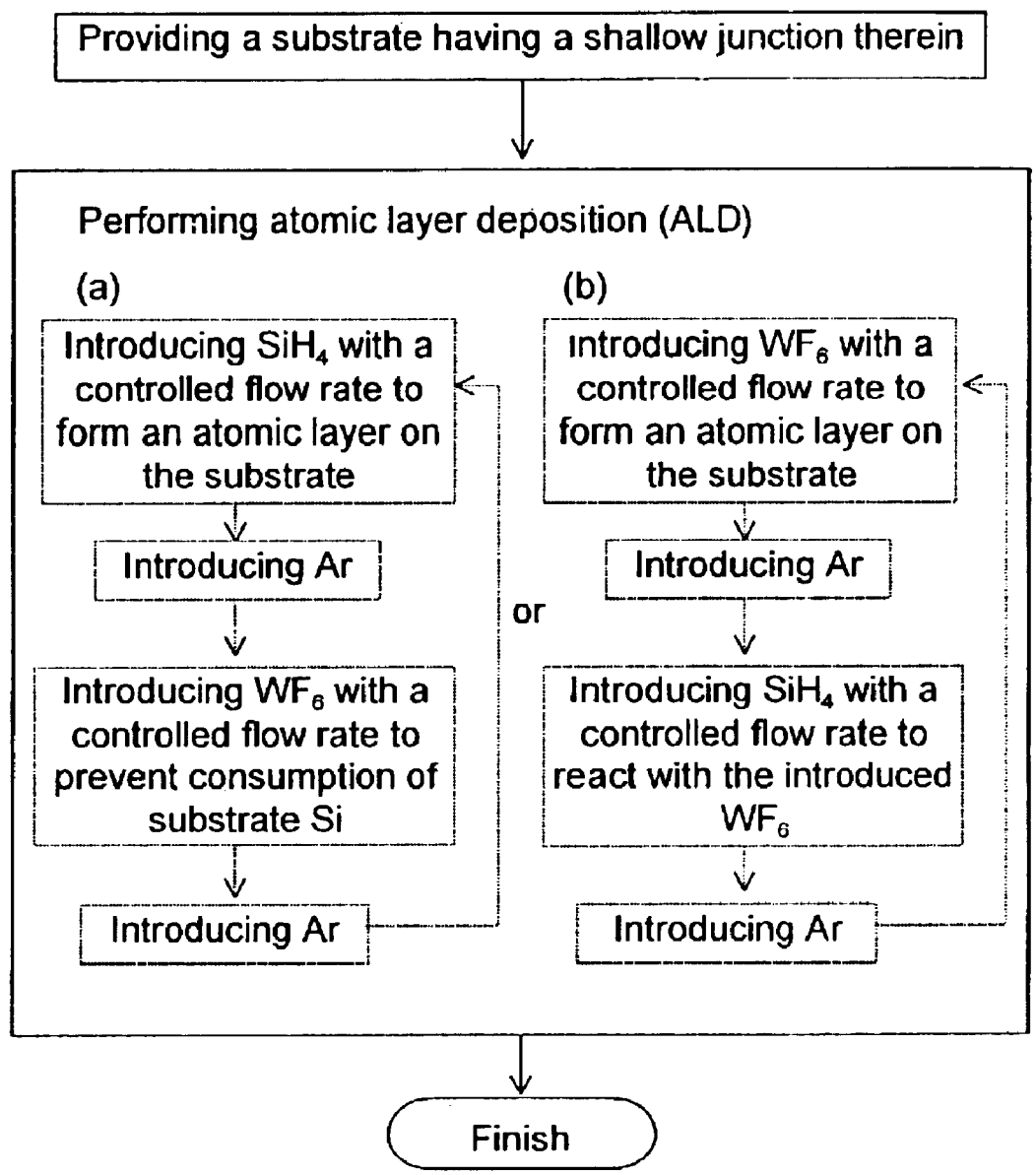
FIG. 1 illustrates a flow chart showing a method for forming a metal salicide layer on a shallow junction according to a preferred embodiment of this invention.

FIG. 1 illustrates a flow chart showing a method for forming a metal salicide layer on a shallow junction according to the preferred embodiment of this invention.

Referring to FIG. 1, in the first step, a substrate having a shallow junction therein is provided. The next step is performing an atomic layer deposition (ALD) process to form a tungsten salicide layer. In the ALD process, silane ($SiH_4$) and tungsten hexafluoride ($WF_6$) are introduced alternatively onto the substrate, wherein either of $SiH_4$ and $WF_6$ can be introduced at first, and argon is introduced after each gas introduction step to remove excess reactive gas and improve the quality of the metal salicide layer. Each $SiH_4$ or $WF_6$ introduction step is conducted for a period such as 8 seconds. If $SiH_4$ is introduced at first, the flow rate of $SiH_4$ is controlled so that only a single layer of $SiH_4$ molecules are adsorbed on the substrate. Then, a pulse of $WF_6$ is introduced to react with the adsorbed $SiH_4$ to form a thin layer of tungsten silicide, while the flow rate of $WF_6$ is controlled so that few silicon atoms in the substrate are consumed. Moreover, the flow rate of $WF_6$ is preferably the same as that of $SiH_4$.

If $WF_6$ is introduced at first, the $WF_6$ molecules are adsorbed on the substrate over the shallow junction, and the flow rate of $WF_6$ is controlled so that only a single layer of molecules are adsorbed and few silicon atoms in the substrate are consumed. A pulse of $SiH_4$ is introduced to react with the adsorbed $WF_6$ to form a thin layer of tungsten silicide. By repeating the two gas introduction steps, a tungsten salicide layer constituted by many thin layers is formed on the shallow junction. Moreover, the flow rate of $SiH_4$ is preferably the same as that of $WF_6$, as in the case of introducing $SiH_4$ at first.

Figure 2A:
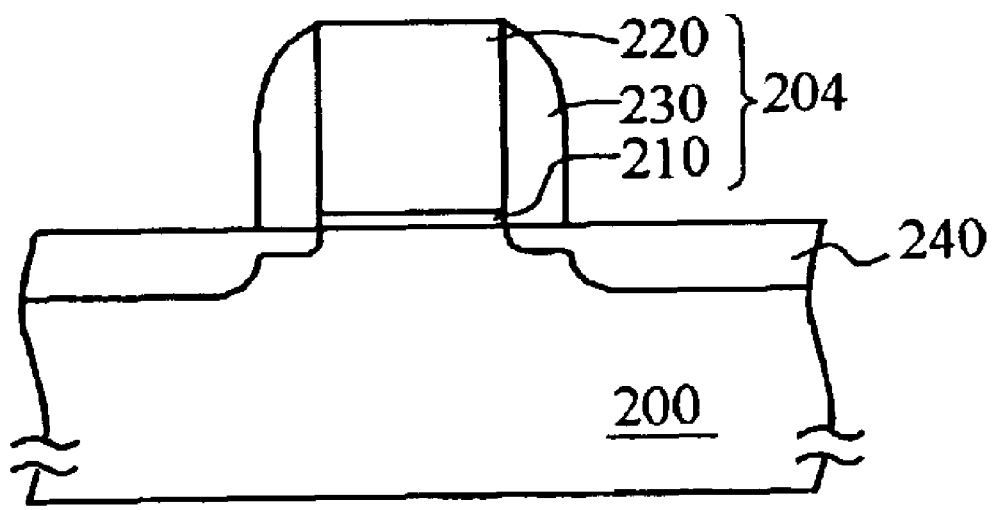
Figure 2B:
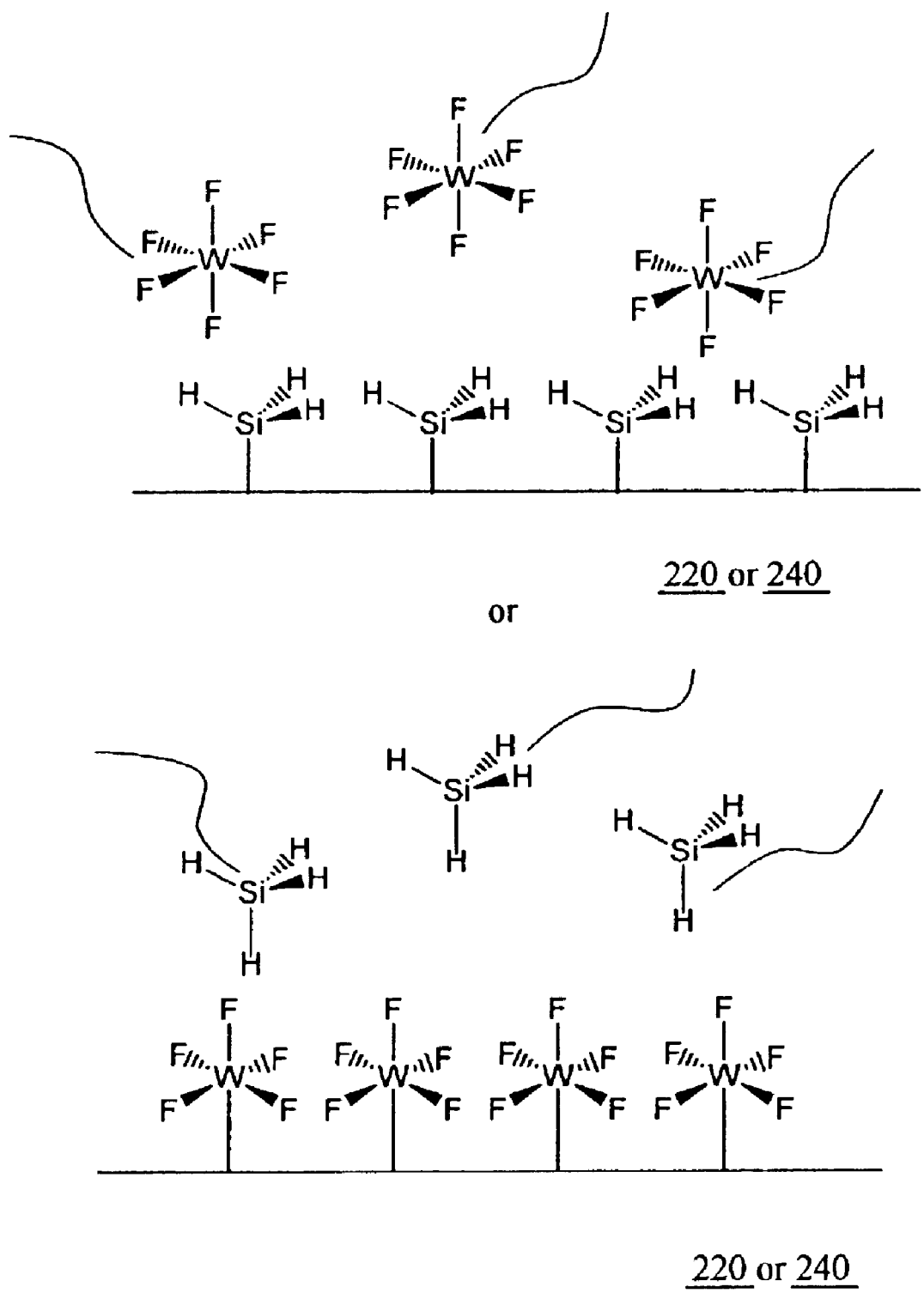

FIGS. 2A–2D illustrate a process flow of forming a metal salicide layer on a shallow junction according to the preferred embodiment of this invention in a cross-sectional view, wherein FIG. 2B illustrates the atomic layer deposition (ALD) process in a microscopic view.

Referring to FIG. 2A, a substrate 200 having a gate structure 204 thereon and a source/drain 240 therein is provided, wherein the source/drain 240 is located beside the gate structure 204 and has a shallow junction. The gate structure 204 comprises a gate oxide layer 210 on the substrate 200, a polysilicon gate 220 on the gate oxide layer 210, and an insulating spacer 230 on the sidewall of the polysilicon gate 220.

Figure 2C:
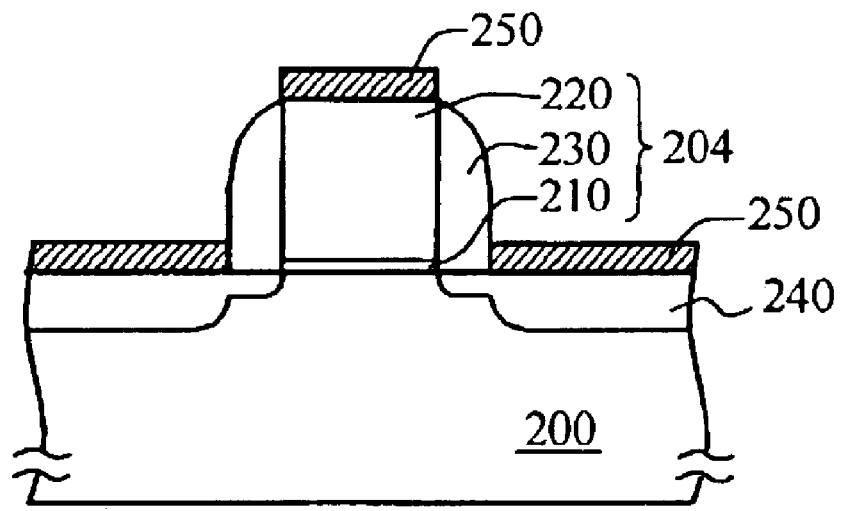

Referring to FIGS. 2B–2C, an atomic layer deposition (ALD) process is performed to form a tungsten salicide layer 250 on the polysilicon gate 220 and the source/drain 240. In the ALD process, silane ($SiH_4$) and tungsten hexafluoride ($WF_6$) are introduced alternatively onto the substrate 200, wherein either of $SiH_4$ and $WF_6$ can be introduced at first, and argon is introduced after each gas introduction step to remove excess reactive gas and improve the quality of the tungsten salicide layer 250. Referring to the upper half of FIG. 2B, if $SiH_4$ is introduced at first, the $SiH_4$ molecules are adsorbed on the polysilicon gate 220 and the source/drain 240 after losing a hydrogen atom. The flow rate of $SiH_4$ is controlled so that only a single layer of molecules is adsorbed. When the next pulse of $WF_6$ is introduced, the adsorbed $SiH_3$ groups react with $WF_6$ to form a thin layer of tungsten silicide (not shown), wherein the flow rate of $WF_6$ is controlled under a certain level so that few silicon atoms in the source/drain 240 are consumed. By repeating the $SiH_4$ introduction step and the $WF_6$ introduction step, a tungsten salicide layer 250 constituted of many thin layers is formed on the polysilicon gate 220 and the source/drain 240 having a shallow junction.

Referring to the lower half of FIG. 2B, if $WF_6$ is introduced at first, the $WF_6$ molecules are adsorbed on the polysilicon gate 220 and the source/drain 240 after losing a fluorine atom. The flow rate of $WF_6$ is controlled so that only a single layer of $WF_6$ molecules are adsorbed and few silicon atoms in the source/drain 240 are consumed. When the next pulse of $SiH_4$ is introduced, the adsorbed $WF_5$ groups react with $SiH_4$ to form a thin layer of tungsten silicide (not shown). By repeating the $WF_6$ introduction step and the $SiH_4$ introduction step, a tungsten salicide layer 250 constituted by many thin layers is formed on the polysilicon gate 220 and the source/drain 240 having a shallow junction.

Figure 2D:
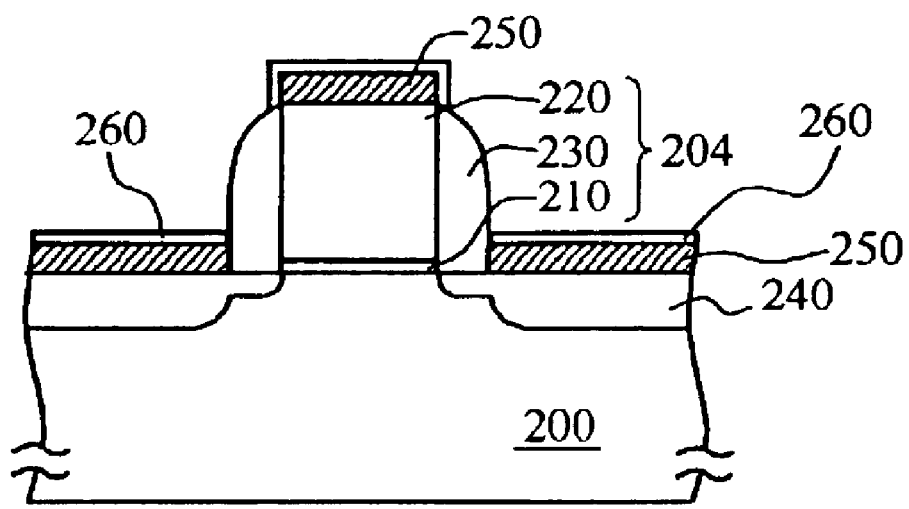

Referring to FIG. 2D, an additional pure tungsten layer 260 can be formed on the tungsten salicide layer 250 to further reduce the resistance of the device. The tungsten layer 260 can be formed by introducing $H_2$ and $WF_6$ together onto the substrate 200 after the $SiH_4$ supply is switched off, or by introducing $H_2$ alone to react with the $WF_6$ that remains in the reaction chamber. If the aforementioned ALD process begins with a $SiH_4$ pulse and ends with a $WF_6$ pulse, it is the unreacted portion of the last pulse of $WF_6$ that reacts with $H_2$. If the ALD process begins with a $WF_6$ pulse and ends with a $SiH_4$ pulse, an additional pulse of $WF_6$ is introduced into the reaction chamber before $H_2$ is introduced.

According to the preferred embodiment of the present invention, few silicon atoms in the substrate are consumed because the flow rate of $WF_6$ is well controlled. Therefore, the shallow junction is not damaged, and severe current leakage is not caused to lower the reliability of the device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for forming a tungsten salicide layer, comprising:

providing a substrate having a shallow junction therein; and performing an atomic layer deposition (ALD) process to form a tungsten salicide layer on the shallow junction, the ALD process being implemented by alternatively introducing $SiH_4$ and $WF_6$ onto the substrate, wherein a flow rate of $WF_6$ is controlled so that few silicon atoms in the substrate are consumed.

2. The method of claim 1, wherein an inert gas is introduced after each $SiH_4$ or $WF_6$ introduction step to remove excess $SiH_4$ or $WF_6$ molecules.

3. The method of claim 2, wherein the inert gas comprises argon (Ar).

4. The method of claim 1, wherein $SiH_4$ is introduced at first, and a flow rate of $SiH_4$ is controlled so that only a single layer of $SiH_4$ molecules are adsorbed on the substrate.

5. The method of claim 1, wherein $WF_6$ is introduced at first, and the flow rate of $WF_6$ is controlled so that only a single layer of $WF_6$ molecules are adsorbed on the substrate.

6. The method of claim 1, wherein a tungsten layer is further formed on the tungsten salicide layer.

7. The method of claim 6, wherein the tungsten layer is formed with reaction of $H_2$ and $WF_6$.

8. The method of claim 1, wherein the substrate further comprises a gate structure thereon comprising a gate dielectric layer, a polysilicon gate on the gate dielectric layer and a spacer on the sidewall of the polysilicon gate, and the tungsten salicide layer is also formed on the polysilicon gate.

9. A method for forming a metal salicide layer, comprising:

providing a substrate having a shallow junction therein; and performing an atomic layer deposition (ALD) process to form a metal salicide layer on the shallow junction, the ALD process being implemented by alternatively introducing a gaseous silicon-containing compound and a gaseous metal-containing compound that react into metal suicide onto the substrate, wherein molecules of the silicon-containing compound or the metal-containing compound can be adsorbed on the substrate; and a flow rate of the metal-containing compound is controlled so that few silicon atoms in the substrate are consumed.

10. The method of claim 9, wherein an inert gas is introduced after each introduction step of the silicon-containing compound or the metal-containing compound to remove excess silicon-containing compound or excess metal-containing compound.

11. The method of claim 10, wherein the inert gas comprises argon (Ar).

12. The method of claim 9, wherein a flow rate of the silicon-containing compound is the same as the flow rate of the metal-containing compound.

13. The method of claim 9, wherein the silicon-containing compound is introduced at first, and a flow rate of the silicon-containing compound is controlled so that only a single layer of molecules are adsorbed on the substrate.

14. The method of claim 9, wherein the metal-containing compound is introduced at first, and the flow rate of the metal-containing compound is controlled so that only a single layer of molecules are adsorbed on the substrate.

15. The method of claim 9, wherein the silicon-containing compound comprises $SiH_4$.

16. The method of claim 9, wherein the metal-containing compound comprises $WF_6$.

17. The method of claim 9, wherein the substrate further comprises a gate structure thereon comprising a gate dielectric layer, a polysilicon gate on the gate dielectric layer and a spacer on the sidewall of the polysilicon gate, and the metal salicide layer is also formed on the polysilicon gate.

* * * * *